United States Patent
Lee et al.

(10) Patent No.: US 6,775,201 B2
(45) Date of Patent: Aug. 10, 2004

(54) METHOD AND APPARATUS FOR OUTPUTTING BURST READ DATA

(75) Inventors: Seong Hoon Lee, Kyoungki-do (KR); Jong Tae Kwak, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/299,267

(22) Filed: Nov. 19, 2002

(65) Prior Publication Data
US 2003/0095442 A1 May 22, 2003

(30) Foreign Application Priority Data
Nov. 22, 2001 (KR) .......................................... 2001-72874

(51) Int. Cl.[7] .............................................. G11C 7/00
(52) U.S. Cl. .......................... 365/230.04; 365/203.02; 365/233

(58) Field of Search ....................... 365/230.02, 230.04, 365/233, 239, 189.02

(56) References Cited

U.S. PATENT DOCUMENTS 6,212,111 B1 * 4/2001 Wright et al. .......... 365/230.03
6,438,063 B1 * 8/2002 Lee ........................ 365/189.07

* cited by examiner

Primary Examiner—Vu A. Le
(74) Attorney, Agent, or Firm—Marshall, Gerstein & Borun LLP

(57) ABSTRACT

An apparatus for outputting burst read data is disclosed which divides input data into an odd number data group and an even number data group, selects a data group including a bit to be first outputted and synchronizes the data group including the bit at rising edges of a clock signal and a data group not including the bit at falling edges of a clock signal, thereby continuously outputting burst read data at a high speed according to output mode set in mode register set using sequential or interleave modes.

17 Claims, 9 Drawing Sheets

METHOD AND APPARATUS FOR OUTPUTTING BURST READ DATA

TECHNICAL FIELD

A method and an apparatus for outputting burst read data in a synchronous memory device are disclosed, and more particularly, a burst read data output method and apparatus are disclosed for effectively outputting a plurality of pre-fetched data bits at high speed.

DESCRIPTION OF THE RELATED ART

According to a conventional read operation at burst read mode in a synchronous memory device, some date bit cells are in sequence accessed according to inputted addresses in response to one read command. For example, if a burst length is 8, 8 bit data are outputted from the cells indicated by the inputted addresses into an output terminal DQ In case of double data rate memory DRAM, data of 2 bits are internally pre-fetched at one time. When a burst length is 8, 4 times successive operations of accessing the data bit cell are required for the purpose of outputting 8 bit data into the output terminal DQ.

Recently, as the memory is highly speeded-up, the number of pre-fetched bits should be increased and moreover the pre-fetched data should be read at one time at higher speed in order to continuously output data of 8 bits into output terminal.

SUMMARY OF THE DISCLOSURE

There is a need for a method and apparatus for high speed outputting burst read data which are read and pre-fetched at one time.

A disclosed method for outputting burst read data from a synchronous memory, comprising: dividing some bit of burst read data outputted from the synchronous memory into an odd number data group and an even number data group; selecting a data bit which should be first outputted, and determining a data group including the selected data bit among the odd number data group and the even number data group; serially-outputting the determined data group at rising edges of the inputted clock signal; serially-outputting the undetermined data group at falling edges of the inputted clock signal; and multiplexing the serially-outputted determined data group and the serially-outputted undetermined data group at rising and falling edges of the inputted clock signal.

There is also provided an apparatus for outputting burst read data outputted from a synchronous memory, comprising: a data group selecting unit for dividing some bit of burst read data outputted from the synchronous memory into an odd number data group and an even number data group, and selecting a data bit which should be first outputted, and then determining a data group including the data bit among divided odd and even number data groups, and finally outputting the determined data group into a first path and the other data group into a second path; an output sequence control unit for outputting an output sequence control signal in order to determine output sequence of the data in the first and the second paths, based on the least significant bit of a column address and a mode control signal set in a mode register set; and an output sequence combining unit for combining data of the first path with that of the second path based on the output sequence control signal and synchronizing the combined data at rising and falling edges of an inputted clock signal, respectively, to output the synchronized data continuously.

DETAILED DESCRIPTION OF THE PRESENTLY PREFERRED EMBODIMENTS

The disclosed method and apparatus for outputting burst read data will be described in more details referring to the accompanied drawings, when are not intended to be limiting.

Figure 1:
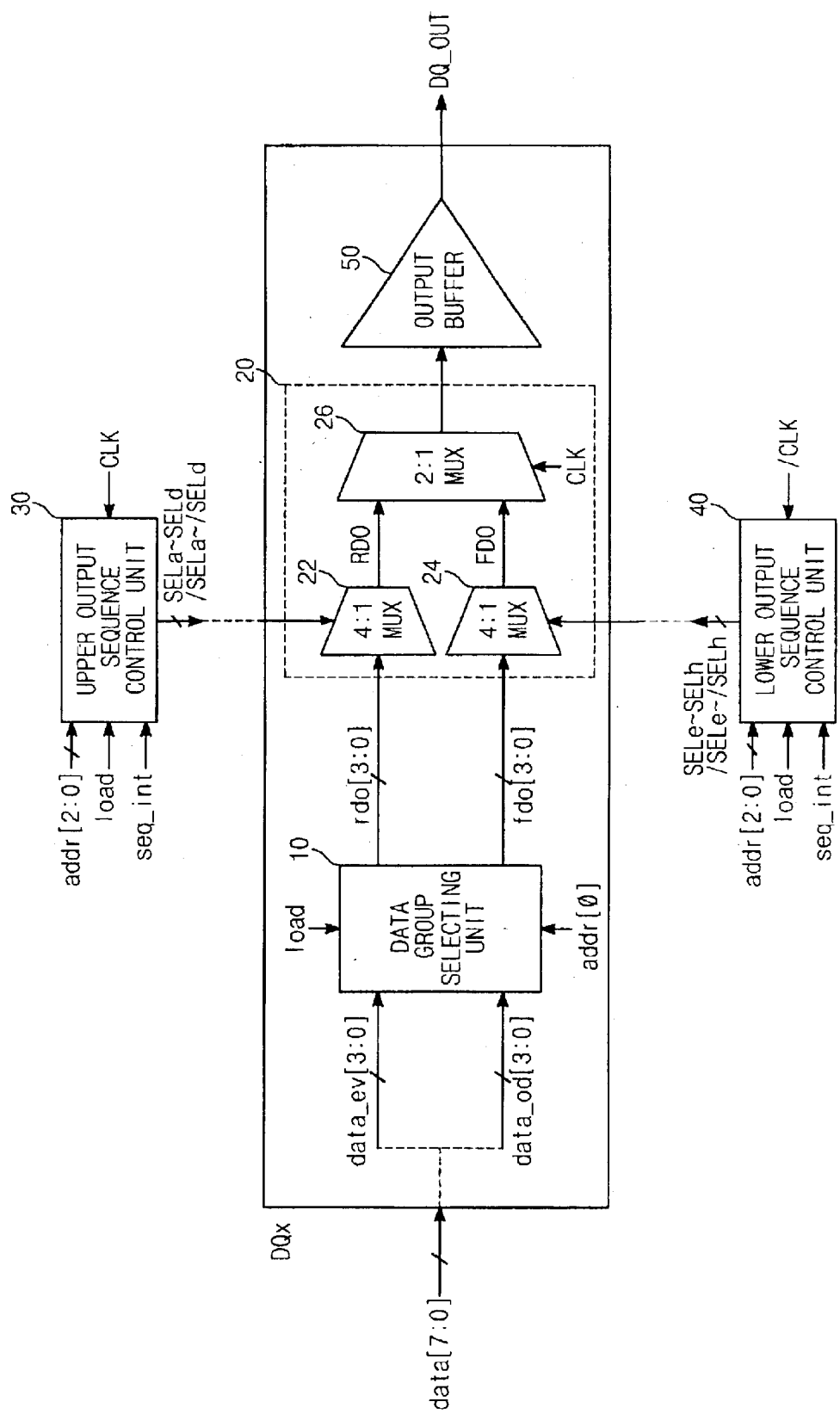
FIG. 1 is a block diagram illustrating an apparatus for outputting burst read data in accordance with a preferred embodiment.

FIG. 1 is a block diagram illustrating an apparatus for outputting burst read data in accordance with a preferred embodiment.

Although one output terminal DQx is disclosed in FIG. 1, the present invention can include n of output terminals (DQ0 to DQn−1) which are arranged in parallel. And, each output terminal receive burst read data (data[7:0]) of 8 bits and output DQ-OUT.

Referring to FIG. 1, the apparatus includes a data group selecting unit 10, a mutilplexing unit 20, upper and lower output sequence control units 30 and 40, and an output buffer 50.

The data group selecting unit 10 receive 8 bit burst read data (referred as data [7:0] in FIG. 1). Here, the inputted 8 bit data [7:0] are previously divided into an even number data group (data[0], data[2], data[4], data[6]=data_ev[3:0]) and an odd number data group (data[1], data[3], data[5], data[7]=data_od[3:0]). This dividing can be achieved by regulating the arrangement of fetched lines (not shown in FIG. 1). Accordingly, the data group selecting unit 10 receives the even number data group (data_ev[3:0]) and the odd number data group (data_od[3:0]).

The data group selecting unit 10 selects a data bit which should be first outputted, with accordance to a selecting control signal (addr[0]) and then determines a data group including the data bit among the even number data group (data_ev[3:0]) and the odd number data group (data_od[3:0]). According to a loading control signal (load), the data group selecting unit 10 outputs the determined data group including the selected data bit as an upper data group (rdo[3:0]) and the other data group as a lower data group (fdo[3:0]).

The multiplexing unit 20 includes 4 by 1 multiplexers 22 and 24, and 2 by 1 multiplexer 26. Output (SELa to SELd, /SELa to /SELd) of the upper output sequence control unit 30 and output (sELe to SELh, /SELe to SELh) of a lower output sequence control unit 40 are connected to 4 by 1 multiplexers 22 and 24 of the output terminal (DQ0 to DQn), respectively.

The upper 4 by 1 multiplexer 22 outputs a series data RD0 of the upper data group (rdo[3:0]), according to output sequence determined by output (SELa to SELd, /SELa to /SELd) of the upper output sequence control unit 30. The lower 4 by 1 multiplexer 24 outputs a series data FD0 of the lower data group (fdo[3:0]), according to output sequence determined by output (SELe to SELh, /SELe to /SELh) of the lower output sequence control unit 40.

The data RD0 and FD0 are sequentially selected from a 2 by 1 multiplexer 26 and outputted in series. The outputted data are buffered in an output buffer 50. As a result, a final output DQ_OUT is outputted. Here, a structure of DQx is shown because all output terminals DQ0 to DQn have the same structure.

Figure 2:
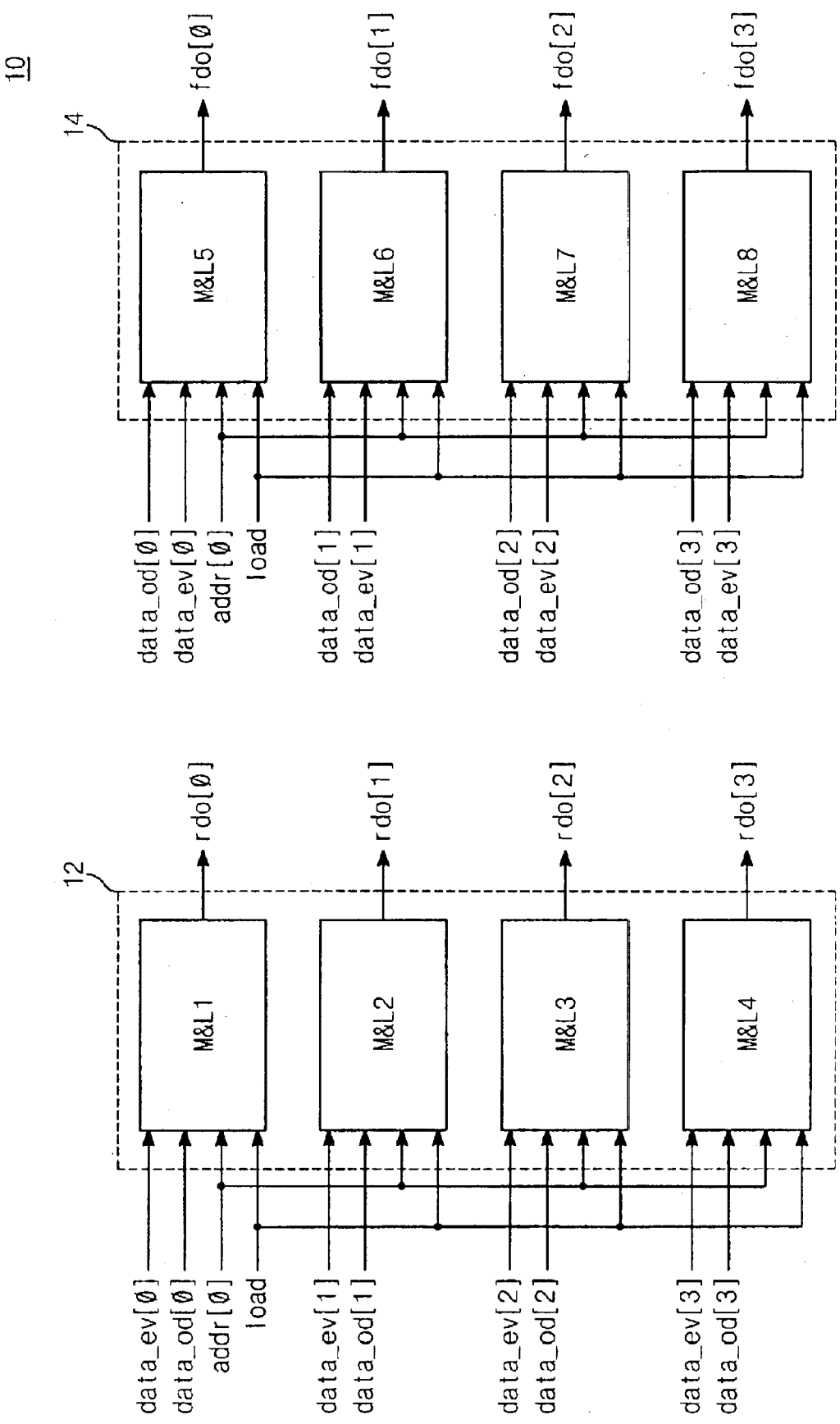
FIG. 2 is a circuit diagram illustrating a data group selecting unit in accordance with a preferred embodiment.

FIG. 2 is a circuit diagram illustrating a data group selecting unit 10 in accordance with a preferred embodiment. A data group selecting unit 10 is divided into an upper data group selecting unit 12 having four 2 by 1 multiplexers and four latches M&L1 to M&L4 and a lower data group selecting unit 14 having four 2 by 1 multiplexers and four latches M&L5 to M&L8.

The upper data group selecting unit 12 has the same structure with the lower data group selecting unit 14 except having the opposite sequence of inputted data bits.

Figure 3:
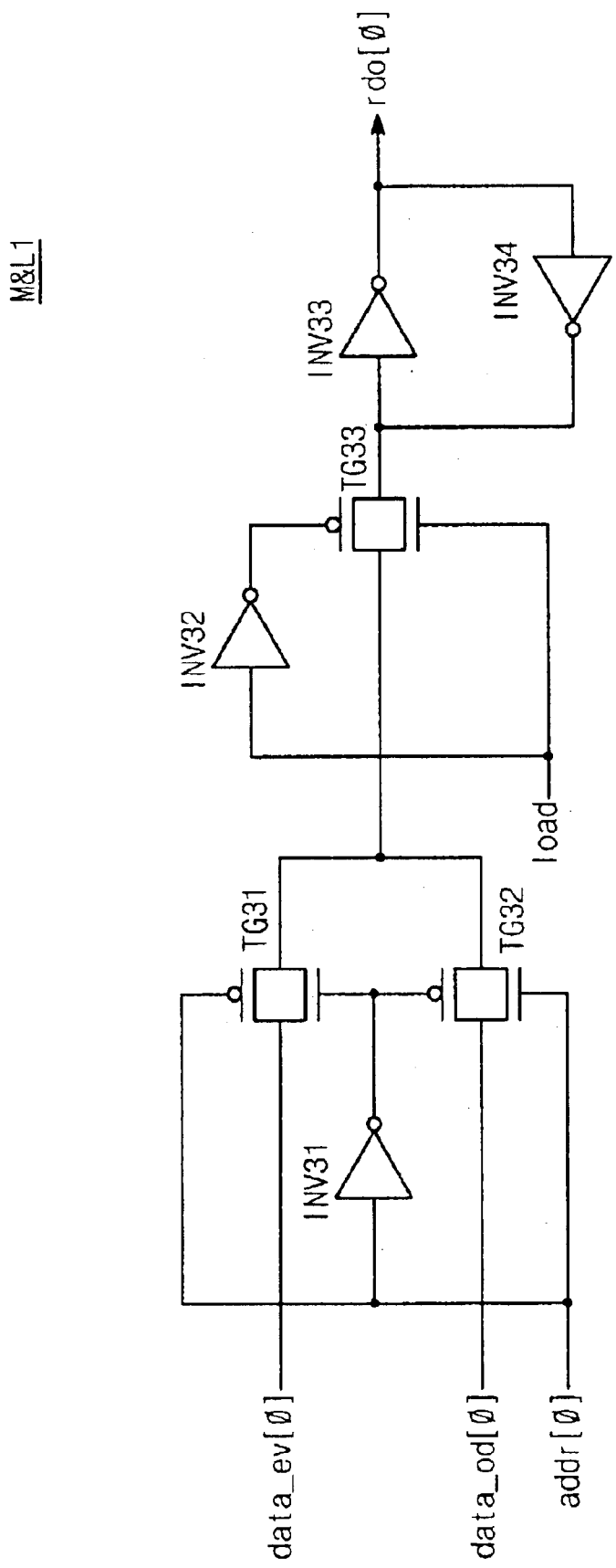
FIG. 3 is a block diagram illustrating one of the 2 by 1 multiplexers and latches of the upper and lower data group selecting units.

FIG. 3 is a block diagram illustrating one M&L1 of eight 2 by 1 multiplexers and latches of the upper and lower data group selecting units 12 and 14. Relevant bit signals data_ev[0] and data_od[0] among the even number data group (data_ev[3:0]) and the odd number data group (data_od[3:0]) are inputted into transmission gate TG31 and TG32, respectively. A least significant bit signal addr[0] of a column address is inputted into a gate of PMOS forming TG31 and a gate of NMOS forming TG32. An inverted signal of the least significant bit signal addr[0] by an inverter INV31 is also inputted into a gate of PMOS forming TG31 and a gate of NMOS forming TG32. Then, one of the even number data_ev[0] and the odd number data_od[0] is outputted into a transmission gate TG33 based on the least significant bit addr[0] of column address.

A loading control signal (load) and its inverted signal are inputted into gates of NMOS and PMOS forming TG33, respectively. When the load becomes 'high', one of data_ev[0] and data_od[0] outputted from TG31 and TG32 is outputted. The outputted data is latched in a latch formed of inverters INV33 and INV34 and outputted into a signal rdo[0] of the upper data group.

The rest multiplexers and latches M&L2 to M&L8 will not be explained because they have the same structure with M&L1.

Thereafter, a data group including data to be first outputted among data_ev[0] and data_od[0] inputted according to addr[0] is outputted from the upper data group 12. A data group including data to be next outputted is outputted from the lower data group 14. In other words, when a selecting control signal addr[0] is 'high', a data group including data to be first outputted among data_ev[0] is outputted from the upper data group 12 and a data group including data to be next outputted among data_od[0] is outputted from the lower data group 14. When addr[0] is 'low', a data group including data to be first outputted among data_od[0] is outputted from the upper data group 12 and a data group including data to be next outputted among data_ev[0]is outputted from the lower data group 14.

Here, the input of the upper data group selecting unit 12 is opposite to that of the lower data group selecting unit 14.

In a preferred embodiment, the least significant bit addr[0] of column address is used as a selecting control signal addr[0]. A separate signal may be used as the selecting control signal.

As known from JEDEC standard, a mode control signal seq_int previously inputted in a mode register set MRS by a memory controller shows if data is outputted with a sequential mode or an interleave mode. The least significant 3 bit of column address determines a bit to be first outputted.

When the mode control signal seq_int is 'high' and the least significant 3 bit is '000', data are sequentially outputted in the following order: data[0]→data[1]→data[2]→data[3]→data[4]→data[5]→data[6]→data[7] (sequential mode). When the mode control signal seq_int is 'low' and the least significant 3 bit is '001', data are interleaved and then outputted in the following order: data[1]→data[0]→data[3]→data[2]→data[5]→data[4]→data[7]→data[6] (interleave mode).

It is shown that an even number data is first outputted when a selecting control signal addr[0] is '0' while an odd number data is first outputted when a selecting control signal addr[0] is '1'.

The data of 8 bits (data[7:0]) inputted according to the selecting control signal addr[0] from the data group selecting unit 10 are divided into 4 bits (data_ev[3:0] and data_od[3:0]) of the odd number data and the even number data, respectively. Here, a data group including a bit to be first outputted is outputted into an upper data group rdo[3:0] while a data group not including the bit is outputted into a lower data group fdo[3:0].

As shown in FIG. 1, the upper data group rdo[3:0] and the lower data group fdo[3:0] are inputted into an output sequence combining unit 20, respectively. The output sequence combining unit 20 comprises upper and lower 4 by 1 multiplexers 22 and 24 and a 2 by 1 multiplexer 26 in the next terminal.

Figure 4:
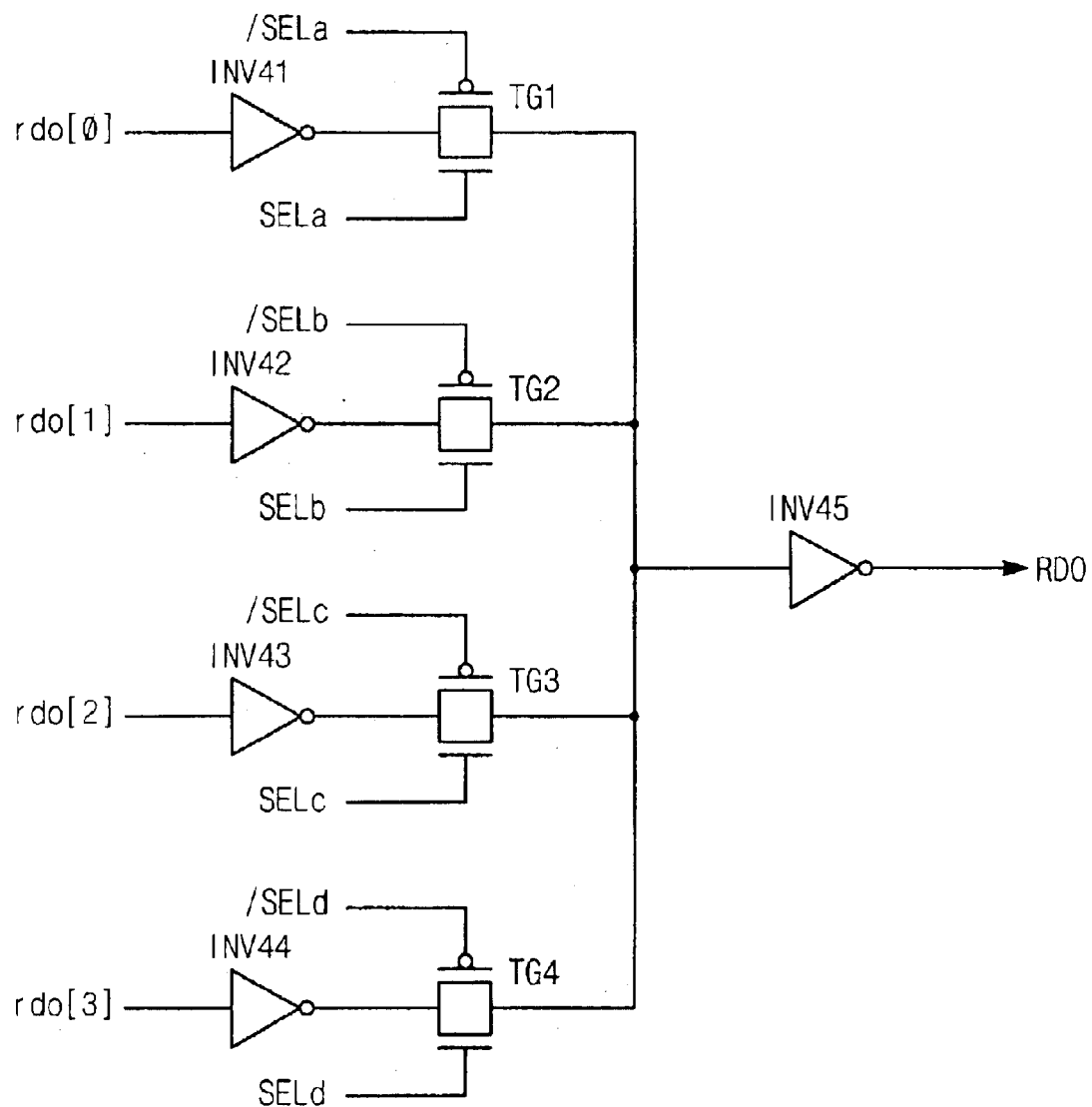
FIG. 4 is a circuit diagram illustrating an upper 4 by 1 multiplexer in accordance with a preferred embodiment.

FIG. 4 is a circuit diagram illustrating an upper 4 by 1 multiplexer 22 in accordance with a preferred embodiment. As shown in FIG. 4, data signals of the upper data group rdo[3:0] is inverted by inverters INV41 to INV44, respectively, and inputted into four transmission gate TG1 to TG4 controlled by output sequence control signals SELa to SELd and their inverted signal /SELa to SELd.

According to output sequence determined by applied sequence of output sequence control signals SELa to SELd and their inverted signal /SELa to /SELd, inverted signals of the upper data group (rdo[0] to rdo[3]) are shifted in series from the transmission gate TG1 to TG4 and then outputted. The inverted signals are re-inverted by an inverter INV45 and then outputted into an upper series data RD0.

The output sequence control signals SELa to SELd are outputted from the output sequence control unit 30 connected to each output terminal DQx in common. As described above, output sequence of data is based on a least significant 3 bit of column address (addr[2:0]) and a mode control signal (seq_int).

The output sequence control unit 30 outputs output sequence selecting signals (SELa to SELd, /SELa to /SELd) to determine output sequence of data (rdo[3:0]) outputted from an upper 4 by 1 multiplexer 22, based on the least significant 3 bit (addr[2:0]) and the mode control signal (seq_int).

The upper 4 by 1 multiplexer 22 outputs an upper data group rdo[3:0] according to output sequence determined by output sequence control signals (SELa to SELd, /SELa to /SELd) synchronized at falling edges of clock signal and inputted.

Although not shown in the drawing, like the upper 4 by 1 multiplexer 22, the lower 4 by 1 multiplexer 24 outputs a lower data group fdo[3:0] according to output sequence determined by output sequence control signals (SELe to SELh, /SELe to /SELh) synchronized at rising edges of clock signal and inputted.

The upper output sequence control unit 30 may comprise a bidirectional ring counter for shifting output sequence control signals (SELa to SELd, /SELa to /SELd) forward or backward and outputting them sequentially. Similarly, the lower output sequence control unit 40 may comprise a bidirectional ring counter for shifting output sequence control signals (SELe to SELd, /SELe to /SELh) forward or backward and outputting them sequentially.

Figure 5:
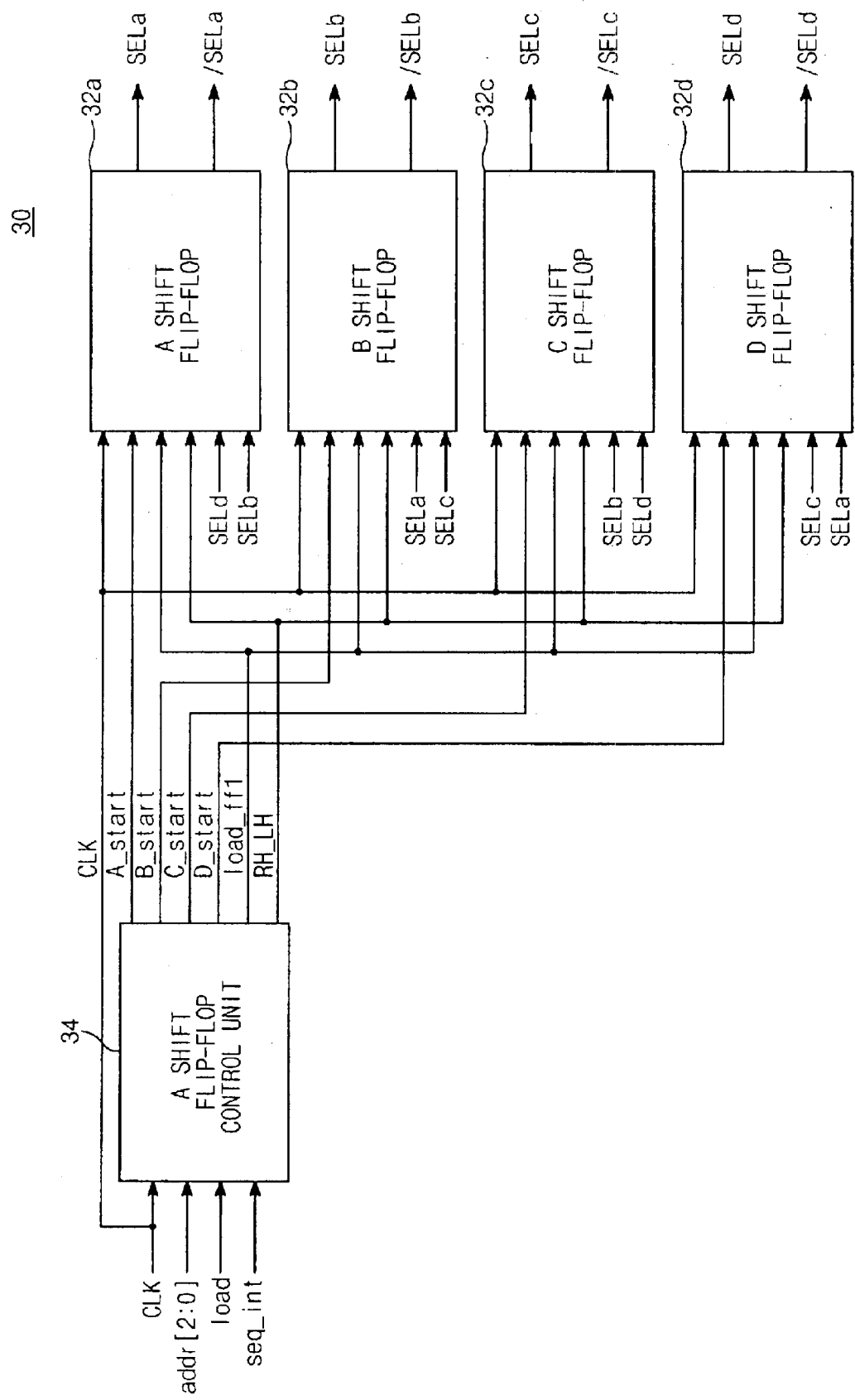
FIG. 5 is a block diagram illustrating an upper output sequence control unit in accordance with a preferred embodiment.

FIG. 5 is a block diagram illustrating an upper output sequence control unit 30 in accordance with a preferred embodiment of the present invention.

As shown in FIG. 5, the upper output sequence control unit 30 comprises four shift flip-flops 32a to 32d for outputting four output sequence control signals SELa to SELd and their inverted signals /SELa to /SELd, respectively, and a shift flip-flop control unit 34 for controlling these four shift flip-flops 32a to 32d.

The shift flip-flop control unit 34 outputs sign-on signals A_start to D_start and a shift direction control signal RH_LH according to output sequence determined by column address least significant 3 bit addr[2:0] and mode control signal seq_int. The unit 34 also outputs a delay loading control signal load_ff1 by delaying a loading control signal load.

The delay loading control signal load_ff1 is used in determining when the unit 34 outputs output sequence control signals SELa to SELd at 'high' by delaying a loading control signal load.

The shift direction control signal RH_LH is used in determining shift direction of bidirectional ring counter comprising shift flip-flops 32a to 32d. When the shift direction control signal RH_LH is 'high' or 'low', the bidirectional ring counter comprising shift flip-flops 32a to 32d shifts forward or backward, and vise versa.

The shift flip-flop control unit 34 outputs one of sign-on signals A_start to D_start connected to A to D shift flip-flops 32a to 32d, respectively, with 'high'. According to outputted sign-on signals A_start to D_start, one of output sequence control signals SELa to SELd outputted from relevant shift flip-flops 32a to 32d becomes first 'high'. Based on shift direction control signal RH_LH inputted into shift flip-flops 32a to 32d, respectively, one of output sequence control signals SELa to SELd outputted from different shift flip-flops 32a to 32d wherein the output sequence control signals SELa to SELd are feedback and inputted becomes next 'high'.

For example, when a signal C_start and a shift direction control signal RH_LH are all 'high', output sequence control signals SELc and /SELc outputted from the C shift flip-flop 32c are made first 'high' by sensing when a loading delay signal load_ff1 becomes 'high'. Because the shift direction control signal RH_LH is 'high', a D shift flip-flop 32d of shift flip-flops 32b and 32d wherein an output sequence control signal SELc is feedback and inputted becomes 'high' at the next clock. Accordingly, the output sequence control signals are outputted with 'high' condition in sequence SELc→SELd→SELa→SELb, synchronized at falling edges of CLK. According to this output, inverted signals /SELa to /SELd of output sequence control signals are outputted with 'low' condition.

The shift flip-flop control unit 34 for controlling signals can achieve into hardware or software by a person having an ordinary skill in the art.

Figure 6:
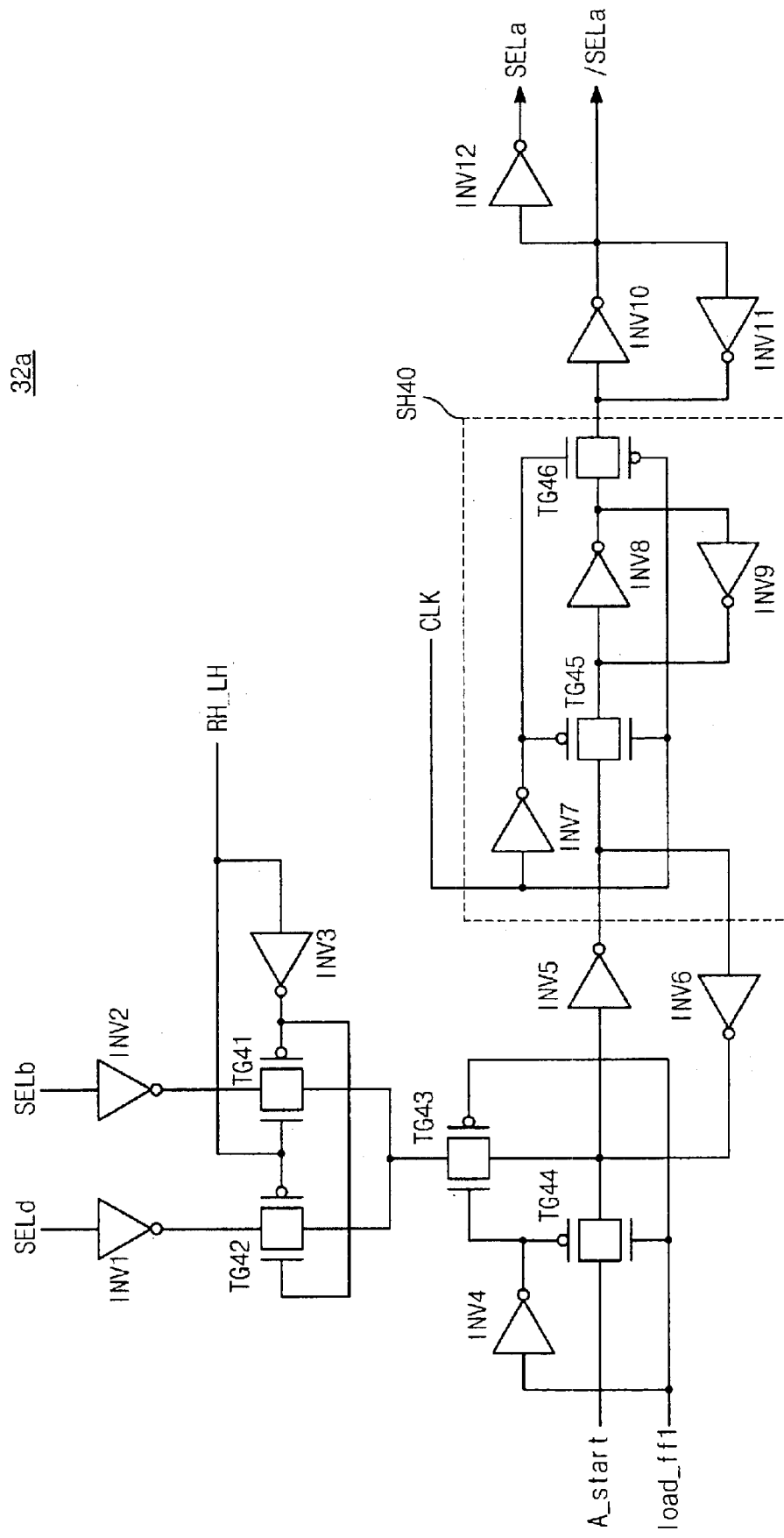
FIG. 6 is a circuit diagram illustrating an example of a shift flip-flop of the shift flip-flops illustrated in the block diagram of FIG. 5.

FIG. 6 is a circuit diagram illustrating an example of A shift flip-flop of shift flip-flops 32a to 32d of FIG. 5. As shown in FIG. 6, two output sequence control signals SELd and SELb outputted from neighboring shift flip-flops 32d and 32b pass through inverters INV1 to INV2, respectively, and then they are inputted into transmission gates TG41 and TG42.

The shift control signal RH_LH is inputted into a gate of NMOS comprising TG41 and a gate of PMOS comprising TG42. The shift control signal RH_LH is inverted by an inverter INV3 and then inputted into a NMOS gate comprising TG41 and a PMOS gate comprising TG42. In other words, the shift control signal RH_LH applied into TG41 and TG42 determines which one of output sequence control signals SELd and SELb is outputted, and then outputs the determined signal into transmission gate TG43.

A sign-on signal A_start outputted from the unit 34 is inputted into transmission gate TG44. The transmission gates TG43 and TG44 are controlled by the control loading control signal load_ff1 and its inverted signal, and they then output the sign-on signal A_start or a selection control signal Seld or SELb into an inverter INV5.

As shown in FIG. 5, when one of sign-on signals A_start to D_start is activated, an output control signal corresponding to shift flip-flops 32a to 32d is activated. The activated output control signals SELa to SELd are feedback and then activate one of different shift flip-flops 32a to 32d. As a result, the sign-on signal A_start is not activated with selection control signals SELd to SELb, simultaneously, as shown in FIG. 6.

Inverters INV5 and INV6 latch output from transmission gates TG43 and TG44 and then output the output into transmission gate TG45.

A clock signal CLK and its inverted clock signal /CLK are inputted into a NMOS gate and a PMOS gate comprising TG45. The transmission gate TG45 outputs the output from INV5 into an inverter INV8 according to a clock signal CLK. After latched by inverters INV8 and INV9, the output from TG45 is outputted into a transmission gate TG46.

A clock signal CLK and its inverted signal /CLK serving as control signal are respectively inputted into PMOS gate and NMOS gate comprising a transmission gate TG46 connected inversely to NMOS gate and PMOS gate comprising TG45.

After latched by INV5 and INV6, a signal outputted from TG44 or TG43 is outputted at falling edges of CLK by synchronization control unit SH40 wherein the CLK is applied.

After latched by inverters INV10 and INV11, the output from TG46 is outputted into an inverted selection control signal /SELa, inverted by inverter INV12 and then outputted into selection control signal SELa.

An output sequence control signal SELa outputted from A shift flip-flop 32a is synchronized at falling edges of CLK and then outputted into the upper 4 by 1 multiplexer 22 of the output sequence combining unit 20 shown in FIG. 4. The output sequence control signal SELa synchronized at falling edges of CLK is inputted into a control signal of the transmission gate TG1 of FIG. 4.

When output sequence control signals SELa and /SELb are synchronized at falling edges of CLK and activated, a signal rdo[0] of the upper data group is synchronized at falling edges of CLK by INV45 and then outputted into an upper series data RD0.

Because the other shift flip-flops 32b to 32d have the same structure with 32a, the upper 4 by 1 multiplexer 22 outputs an upper series data RD0 in series with synchronization at falling edges of CLK according to output sequence control signals SELa to SELd, /SELa to /SELd.

In the same way of the upper 4 by 1 multiplexer, the lower 4 by 1 multiplexer 24 outputs a lower series data FD0 in series with synchronization at rising edges of CLK according to output sequence control signals SELe to SELh, /SELe to /SELh.

The upper and the lower series data RD0 and FD0 outputted from the upper and the lower 4 by 1 multiplexers 22 and 24 are inputted into the 2 by 1 multiplexer 26.

Figure 7:
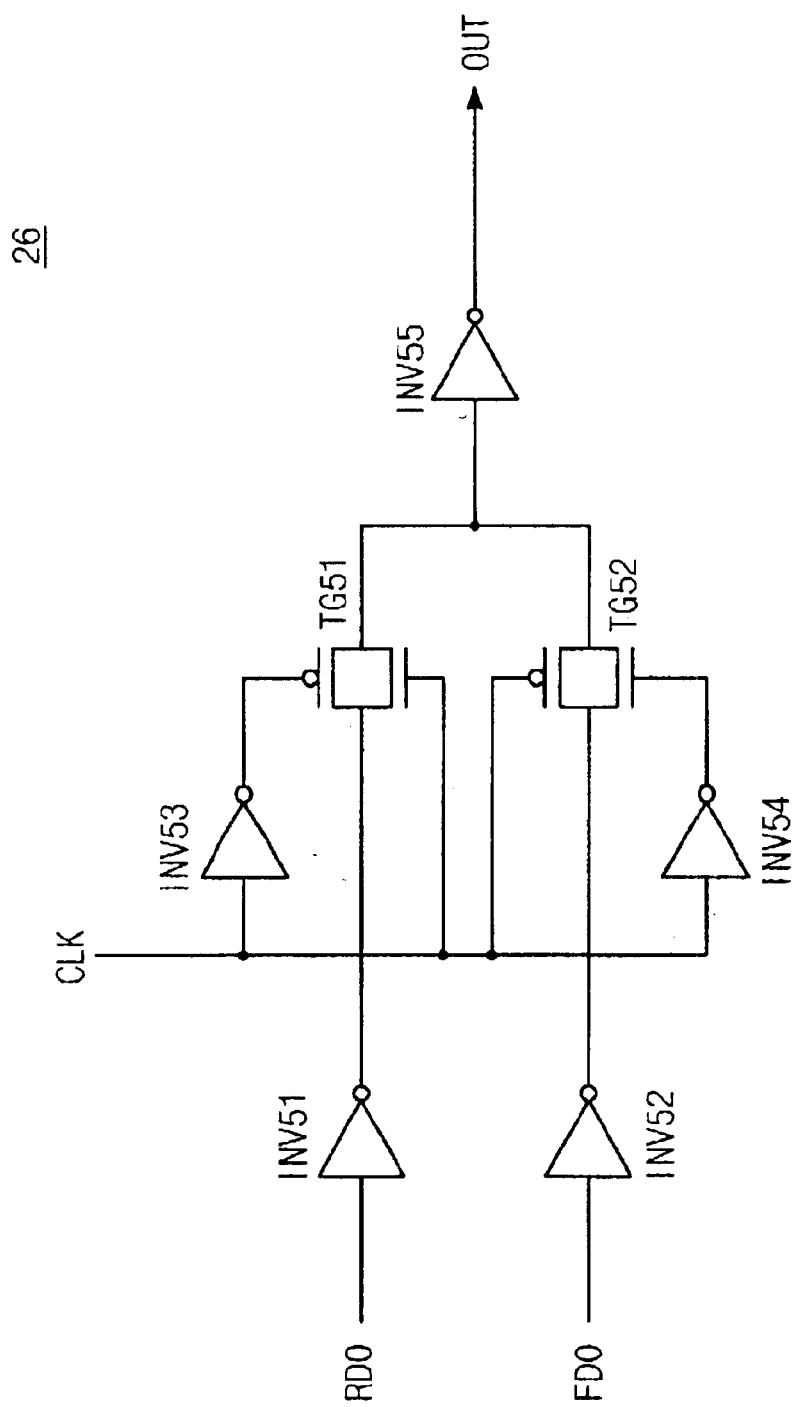
FIG. 7 is a circuit diagram illustrating a 2 by 1 multiplexer of an output sequence combining unit in accordance with a preferred embodiment.

FIG. 7 is a circuit diagram illustrating the 2 by 1 multiplexer 26 of an output sequence combining unit in accordance with a preferred embodiment of the present invention.

The upper series data RD0 synchronized at falling edges of CLK and outputted is inverted by an inverter INV51 and then inputted into a transmission gate TG51. An inverted clock signal /CLK and a clock signal CLK are respectively inputted into PMOS gate and NMOS gate comprising TG51. The upper series data RD0 inverted at rising edges of CLK connected due to control input of TG51 is outputted, re-inverted by INV53 and then outputted. In other words, the upper series data RD0 is synchronized at rising edges of CLK and outputted.

The lower series data FD0 synchronized at rising edges of CLK and outputted is inverted by INV52 and inputted into TG52. A clock signal CLK and its inverted clock signal /CLK are respectively inputted into PMOS gate and NMOS gate comprising a transmission gate. The lower series data FD0 inverted at falling edges of CLK connected due to control input of TG51 is outputted, re-inverted by INV53 and the outputted.

In other words, the upper and the lower series data RD0 and FD0 are synchronized at rising and falling edges, respectively, and in turn outputted in series.

Figure 8:
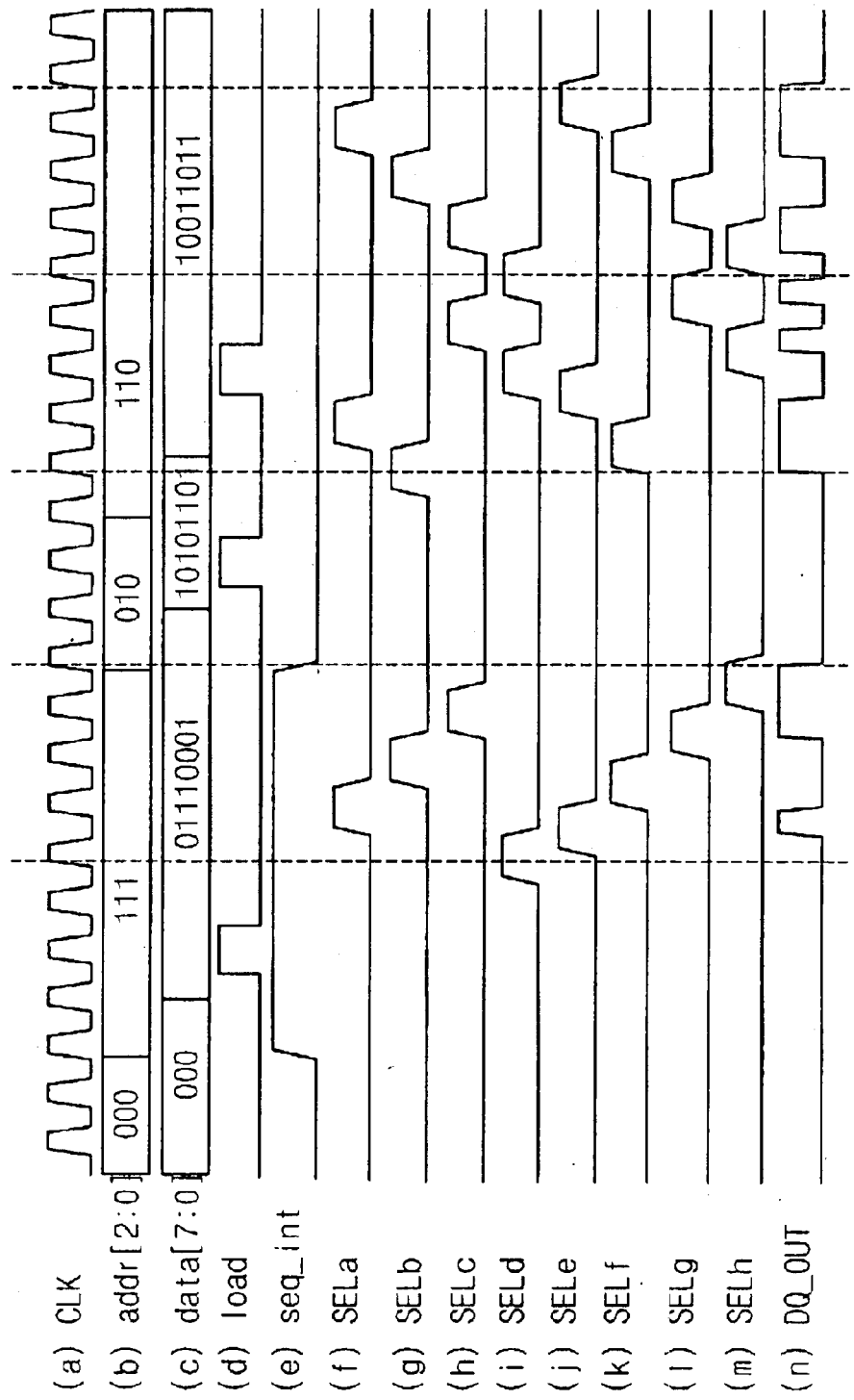
FIG. 8 is a timing diagram illustrating an operating condition of an output apparatus in accordance with a preferred embodiment.

FIG. 8 is a timing diagram illustrating operating condition of an output apparatus in accordance with a preferred embodiment.

As shown in (a) and (c) of FIG. 8, burst read data of 8 bits (data[7:0]) is inputted according to CLK. As shown in (b) and (e) of FIG. 8, column address least significant 3 bit addr[2:0] representing output sequence and mode control signal seq_int representing output mode are inputted, respectively.

As shown in (d), a loading control signal load is internally made to represent timing when prefetched data of 8 bits are externally outputted. When the load is once 'high', data from rising edges of next clock is outputted from output terminal DQ.

As shown in (e), mode control signal seq_int is 'high' for 8 clock cycle and then turn to 'low'. As described above, when seq_int is 'high', sequence mode is set while when 'low' interleave mode is set.

When a loading control signal load is first 'high', column address least significant 3 bit addr[2:0] has a value of binary number '111' (decimal number 7) and mode selection signal seq_int is 'high'. As a result, starting with 7th data of the inputted 8 bit data (01110001), data are outputted with sequence mode in the following sequence: data[7]→data[0]→data[1]→data[2]→data[3]→data[4]→data[5]→data[6]. Because the least significant bit of column address addr[0] is 'high', the data group selecting unit 10 controls output of data group so that odd number data (data_od[0:3]) may be outputted into the upper 4 by 1 multiplexer 22 and even number data (data_eve[0:3]) into the lower 4 by 1 multiplexer 24.

As shown in (f) to (m) of FIG. 8, the upper output sequence control unit 30 activates output sequence control signals with the following sequence: SELd→SELa→Selb→SELc, and then outputs them into the output sequence combining unit 20. The lower output sequence control unit 40 activates output sequence control signals with the following sequence: SELe→SELf→SELg→SELh, and then outputs them into the output sequence combining unit 20.

As a result, in the output sequence combining unit 20, the odd number data (data_od[3:0]) is outputted at rising edges of CLK, the even number data (data_ev[3:0]) at falling edges of CLK. In other words, data of 8 bits are continuously outputted at rising and falling edges of CLK.

As shown in (o), data of 8 bits '01000111' is outputted for 4 clock cycle.

When the next loading control signal load is 'high', column address least significant 3 bit addr[2:0] has a value of binary umber '010' (decimal number 2) and mode selecting signal seq_int is 'low'. As a result, starting with 3th data of the inputted 8 bit data (10101101), data are outputted with interleave mode in the following sequence: data[2]→data[3]→data[0]→data[1]→data[6]→data[7]→data[4]→data[5]. Because the least significant bit of column address addr[0] is 'low', the data group selecting unit 10 controls output of data group so that odd number data (data[1], data[3], data[5], data[7]) may be outputted into the lower 4 by 1 multiplexer 24 and even number data (data[0], data[2], data[4], data[6]) into the upper 4 by 1 multiplexer 22.

Here, the upper output sequence control unit 30 synchronized at falling edges of CLK activates output sequence control signals in the following sequence: SELb→SELa→SELd→SELc. The lower output sequence control unit 30 synchronized at rising edges of CLK activates output sequence control signals in the following sequence: SELf→SELe→SELh→SELg.

The 2 by 1 multiplexer 26 of next terminal outputs the even number data (data[2]→data[0]→data[6]→data[4]) from the upper 4 by 1 multiplexer 22 and the odd number data (data[3]→data[1]→data[7]→data[5]) from the lower 4 by 1 multiplexer 24. In other words, data of 8 bits are continuously interleaved at rising and falling edges of CLK and the outputted.

As shown in (o) of FIG. 8, data of 8 bits '11100101' are outputted for 4 clock cycle.

Thereafter, data of 8 bits '01100111' are outputted for 4 clock cycle in the same way. As a result, prefetched data of 16 bits may be outputted for 8 clock cycle.

Figure 9:
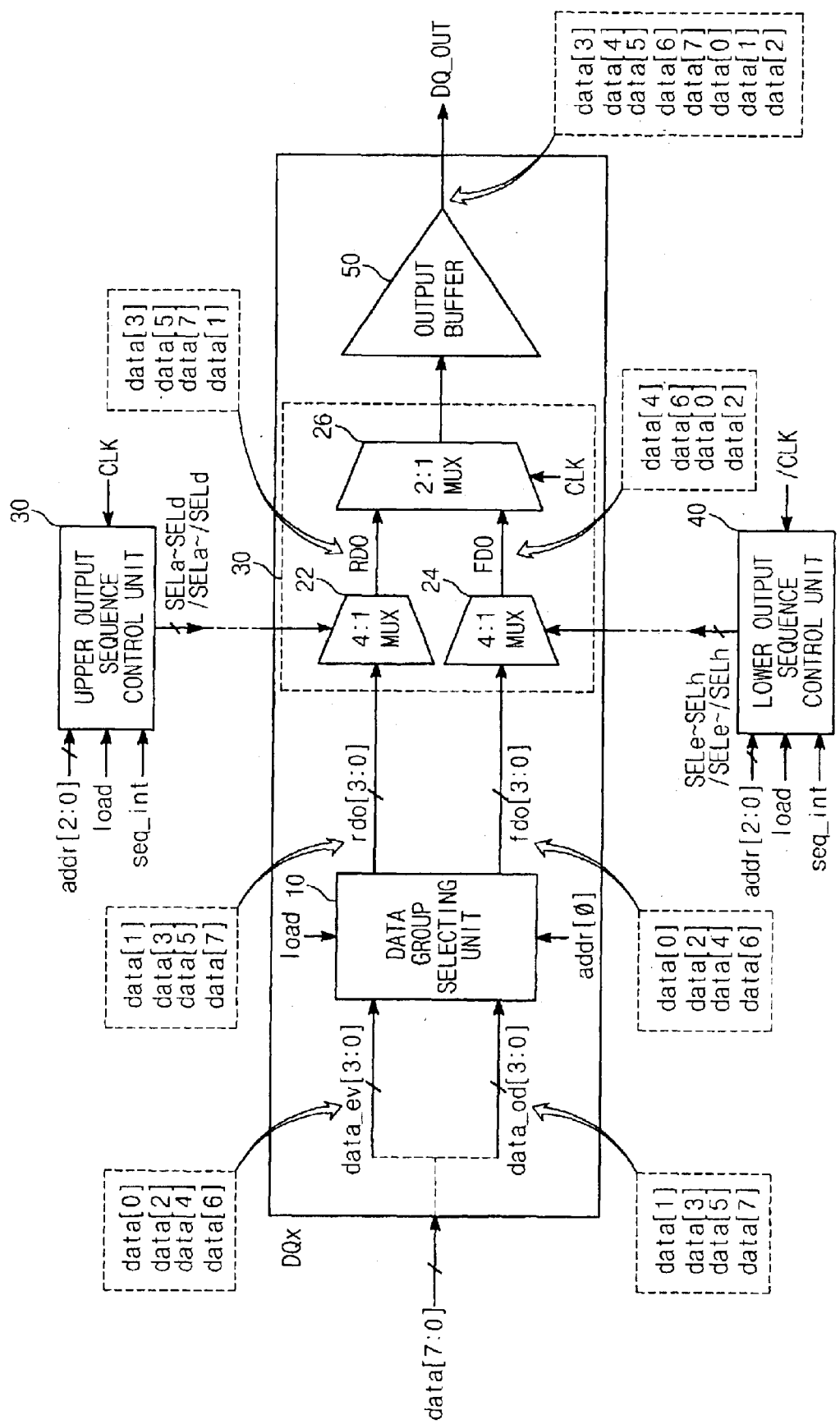
FIG. 9 is a diagram illustrating condition of data in each line of FIG. 1.

For example, data condition on each line is shown in FIG. 9 when column address least significant 3 bit has a value of decimal number '3'.

FIG. 9 is a diagram illustrating condition of data in each line of FIG. 1.

It is obvious to a person having an ordinary skill in the art that the upper output sequence control unit may be connected to the lower 4 by 1 multiplexer and the lower output sequence control unit to the upper 4 by 1 multiplexer.

Additionally, it is obvious to a person having an ordinary skill in the art that a clock signal /CLK inverted into the 2 by 1 multiplexer 26 of the output sequence may be inputted.

The disclosed method and apparatus for outputting burst read data may control data output sequence of all output terminals using only two ring counters, thereby optimizing output sequence of data with small area.

In addition, burst read data are outputted at rising and falling edges, respectively, thereby improving output speed of output apparatus.

While the disclosed method and apparatus are susceptible to various modifications and alternative forms, specific embodiments have been shown by way of example in the drawings and described in detail herein. However, it should be understood that this disclosure is not limited to the particular forms disclosed. Rather, this disclosure covers all modifications, equivalents, and alternatives falling within the spirit and scope of the invention as defined in the appended claims.

What is claimed is:

1. A method for outputting burst read data from a synchronous memory comprising:
   (a) dividing bits of burst read data outputted from the synchronous memory into an odd number data group and an even number data group;
   (b) selecting a data bit which should be first outputted, and determining a data group including the selected data bit among the odd number data group and the even number data group;
   (c) serially-outputting the determined data group at rising edges of the inputted clock signal;
   (d) serially-outputting the undetermined data group at falling edges of the inputted clock signal; and
   (e) multiplexing the serially-outputted determined data group and the serially-outputted undetermined data group at rising and falling edges of the inputted clock signal.

2. The method according to claim 1, wherein the selecting of the data bit which should be first outputted in the step (b), is based on the least significant bit of a column address signal of the synchronous memory device.

3. The method according to claim 1, wherein the step (c) further comprises:
   determining output sequence based on a mode control signal stored in a mode register set and a column address low-order 3 bit;
   synchronizing each output sequence control signal corresponding to the output sequence at falling edges of an inputted clock signal to activate the synchronized signal; and
   synchronizing the data group including a bit to be first outputted at rising edges of an inputted clock signal, respectively, based on the output sequence control signal to output the synchronized data group in series.

4. The method according to claim 1, wherein the step (d) further comprises:
   determining output sequence based on a mode control signal stored in a mode register set (MRS) and a column address low-order 3 bit;
   synchronizing each output sequence control signal corresponding to the output sequence at falling edges of an inputted clock signal based on an inputted clock signal to activate the synchronized signal; and
   synchronizing the data group not including a bit to be first outputted at rising edges of an inputted clock signal, respectively, based on the output sequence control signal to output the synchronized data group in series.

5. An apparatus for outputting burst read data outputted from a synchronous memory comprising:
   a data group selecting unit for dividing some bit of burst read data outputted from the synchronous memory into an odd number data group and an even number data group, and selecting a data bit which should be first outputted, and then determining a data group including the data bit among divided odd and even number data groups, and finally outputting the determined data group into a first path and the other data group into a second path;
   an output sequence control unit for outputting an output sequence control signal in order to determine output sequence of the data in the first and the second paths, based on the least significant bit of a column address and a mode control signal set in a mode register set; and
   an output sequence combining unit for combining data of the first path with that of the second path based on the output sequence control signal and synchronizing the combined data at rising and falling edges of an inputted clock signal, respectively, to output the synchronized data continuously.

6. The apparatus according to claim 5, wherein the data group selecting unit further comprises:
   a plurality of multiplexer means for selecting a data of the odd number data group and a data of the even number data group, respectively, based on the least significant bit of the column address; and
   a plurality of output control means for controlling the output of data selected from the plurality of the multiplexer means, respectively, based on a loading control signal applied externally.

7. The apparatus according to claim 5, wherein the output sequence control unit further comprises:
   a plurality of first shift flip-flop means for outputting first output sequence control signals controlling output sequence of the data group outputted into the first path, respectively;
   a first output sequence control unit having a first shift flip-flop control means for controlling the plurality of the first shift flip-flop means;
   a plurality of second shift flip-flop means for outputting second output sequence control signals controlling output sequence of the data group outputted into the second path, respectively;
   a second output sequence control unit having a second shift flip-flop control means for controlling the plurality of the second shift flip-flop means.

8. The apparatus according to claim 7,
   wherein the first shift flip-flop control means of the first output sequence control unit activates a sign-on signal using one of the plurality of the first shift flip-flop means, based on the least significant 3 bit of the column address, to output the activated signal and outputs a shift direction control signal into the plurality of the first shift flip-flop means, respectively, and
   wherein one of the plurality of the first shift flip-flop means activates its output sequence control signal according to the activated sign-on signal while the rest of the plurality of the first shift flip-flop means not changing its output sequence control signal activates its output sequence control signal, shifted in turn according to the shift direction control signal.

9. The apparatus according to claim 7, wherein the second shift flip-flop control means of the second output sequence control unit activates a sign-on signal using one of the plurality of the second shift flip-flop means, based on the least significant 3 bit of the column address, to output the activated signal and outputs a shift direction control signal into the plurality of the second shift flip-flop means, respectively, wherein one of the plurality of the second shift flip-flop means activates its output sequence control signal according to the activated sign-on signal while the rest of the plurality of the second shift flip-flop means not changing its output sequence control signal activates its output sequence control signal, shifted in turn according to the shift direction control signal.

10. The apparatus according to claim 7, wherein the first output sequence control unit outputs the output sequence control signal synchronized at falling edges of a clock signal, and wherein the second output sequence control unit outputs the output sequence control signal synchronized at rising edges of a clock signal.

11. The apparatus according to claim 8, wherein the first output sequence control unit outputs the output sequence control signal synchronized at falling edges of a clock signal, and wherein the second output sequence control unit outputs the output sequence control signal synchronized at rising edges of a clock signal.

12. The apparatus according to claim 9, wherein the first output sequence control unit outputs the output sequence control signal synchronized at falling edges of a clock signal, and wherein the second output sequence control unit outputs the output sequence control signal synchronized at rising edges of a clock signal.

13. The apparatus according to claim 7, wherein the second output sequence control unit outputs the output sequence control signal synchronized at falling edges of a clock signal, wherein the first output sequence control unit outputs the output sequence control signal synchronized at rising edges of a clock signal.

14. The apparatus according to claim 8, wherein the second output sequence control unit outputs the output sequence control signal synchronized at falling edges of a clock signal, wherein the first output sequence control unit outputs the output sequence control signal synchronized at rising edges of a clock signal.

15. The apparatus according to claim 9, wherein the second output sequence control unit outputs the output sequence control signal synchronized at falling edges of a clock signal, wherein the first output sequence control unit outputs the output sequence control signal synchronized at rising edges of a clock signal.

16. The apparatus according to claim 5, wherein the output sequence combining further comprises:

a first path output sequence selecting means for selecting data of the first path according to output sequence set from the first output sequence control signal to output the data in series;

a second path output sequence selecting means for selecting data of the second path according to output sequence set from the second output sequence control signal to output the data in series; and a combination selecting means for synchronizing data outputted from the first and the second output sequence selecting means at rising and falling edges of an inputted clock signal, respectively, to output the data continuously.

17. The apparatus according to claim 16, wherein the combination selecting means operates based on an inverted signal of the inputted clock signal.

* * * * *